(12) United States Patent
Tanaka et al.

(10) Patent No.: US 11,160,168 B2
(45) Date of Patent: Oct. 26, 2021

(54) ELECTRONIC COMPONENT BUILT-IN WIRING BOARD AND METHOD FOR MANUFACTURING THE SAME

(71) Applicant: IBIDEN CO., LTD., Ogaki (JP)

(72) Inventors: Yusuke Tanaka, Ogaki (JP); Tomohiro Futatsugi, Ogaki (JP); Yuichi Nakamura, Ogaki (JP); Yoshiki Matsui, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/871,431

(22) Filed: May 11, 2020

(65) Prior Publication Data

US 2020/0359500 A1 Nov. 12, 2020

(30) Foreign Application Priority Data

May 9, 2019 (JP) .............................. JP2019-089107

(51) Int. Cl.
| | |
|---|---|
| *H05K 1/18* | (2006.01) |
| *H05K 1/02* | (2006.01) |
| *H05K 3/28* | (2006.01) |
| *H05K 3/46* | (2006.01) |
| *H05K 3/00* | (2006.01) |

(52) U.S. Cl.
CPC ........... *H05K 1/183* (2013.01); *H05K 1/0219* (2013.01); *H05K 1/185* (2013.01); *H05K 3/0017* (2013.01); *H05K 3/28* (2013.01); *H05K 3/4697* (2013.01); *H05K 2201/0191* (2013.01)

(58) Field of Classification Search
CPC ............................................ H05K 1/182–185

USPC .......................................................... 361/761
See application file for complete search history.

(56) References Cited

U.S. PATENT DOCUMENTS

| | | | | |
|---|---|---|---|---|
| 2010/0206619 | A1* | 8/2010 | Chen | H05K 1/183 174/252 |
| 2012/0227261 | A1* | 9/2012 | Inui | H05K 1/0206 29/849 |
| 2015/0327362 | A1* | 11/2015 | Maeda | H05K 3/4647 361/761 |
| 2015/0382471 | A1* | 12/2015 | Furutani | H05K 1/116 361/763 |

(Continued)

FOREIGN PATENT DOCUMENTS

JP 2006-019441 A 1/2006

*Primary Examiner* — Hoa C Nguyen

(74) *Attorney, Agent, or Firm* — Oblon, McClelland, Maier & Neustadt, L.L.P.

(57) ABSTRACT

A wiring board for a built-in electronic component includes a first insulating layer, a second insulating layer formed under the first insulating layer, and a conductor layer formed on an upper surface of the second insulating layer such that a cavity is formed to penetrate through the first insulating layer and the conductor layer and expose the second insulating layer at a bottom of the cavity and is formed to accommodate an electronic component therein. The first insulating layer and the conductor layer are formed such that the cavity has a first inner side surface extending from an upper opening edge to a position closer to the second insulating layer, and a lateral expansion part formed between a lower edge of the first inner side surface and the second insulating layer and extending outward from the lower edge of the first inner side surface.

20 Claims, 16 Drawing Sheets

(56) References Cited

U.S. PATENT DOCUMENTS

| | | | |
|---|---|---|---|
| 2016/0118325 A1* | 4/2016 | Wang | H05K 1/188 |
| | | | 257/774 |
| 2016/0338202 A1* | 11/2016 | Park | H01L 24/00 |
| 2017/0094796 A1* | 3/2017 | Lor | H05K 3/284 |
| 2017/0265298 A1* | 9/2017 | Zhang | H05K 1/183 |
| 2019/0139876 A1* | 5/2019 | Lee | H01L 21/4853 |

* cited by examiner

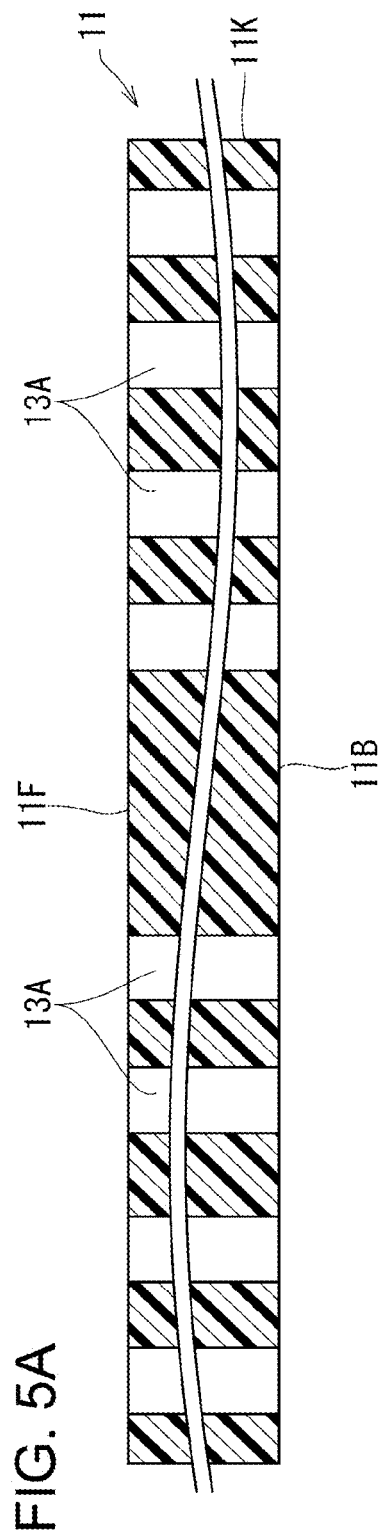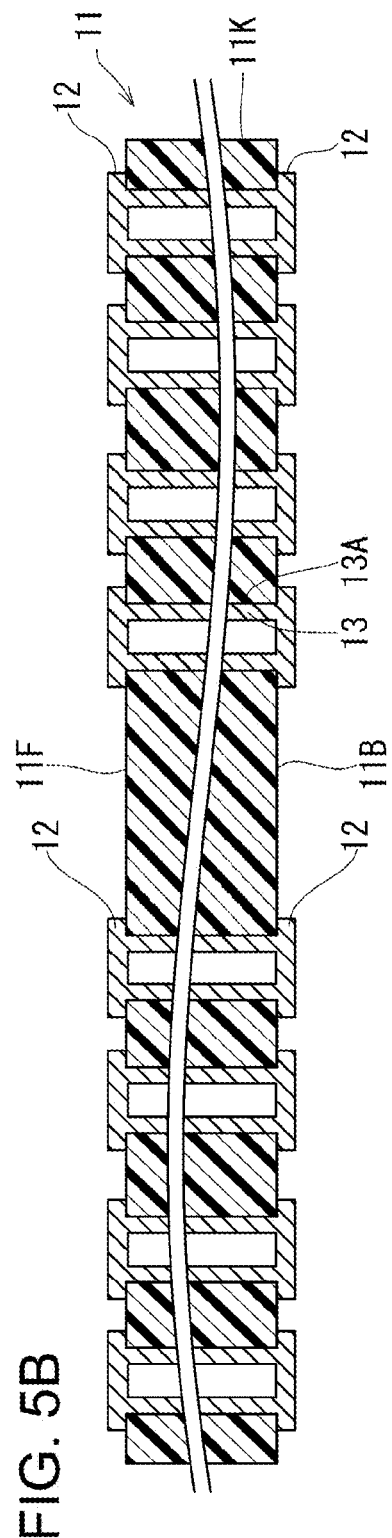
FIG. 5A
FIG. 5B

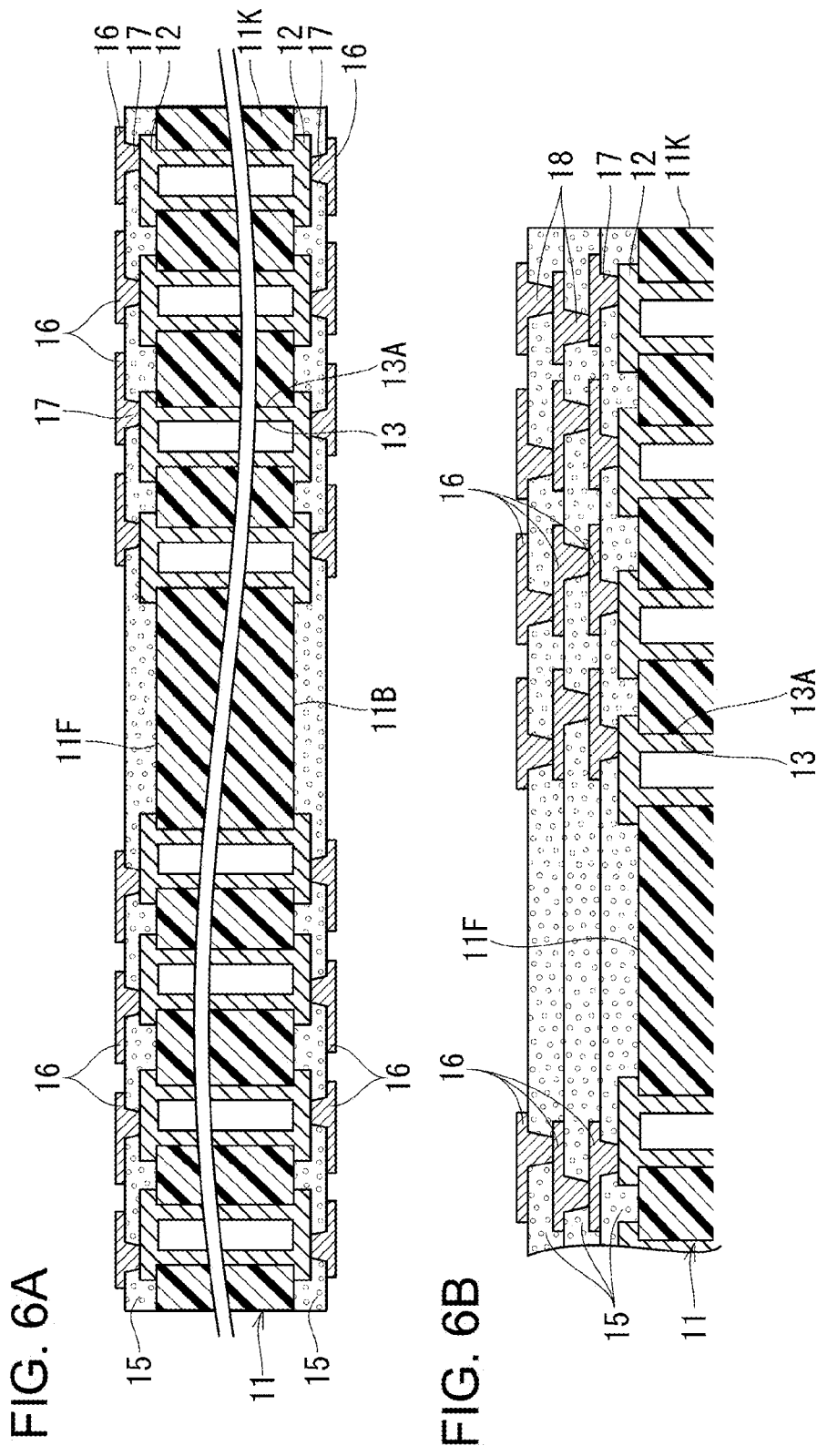

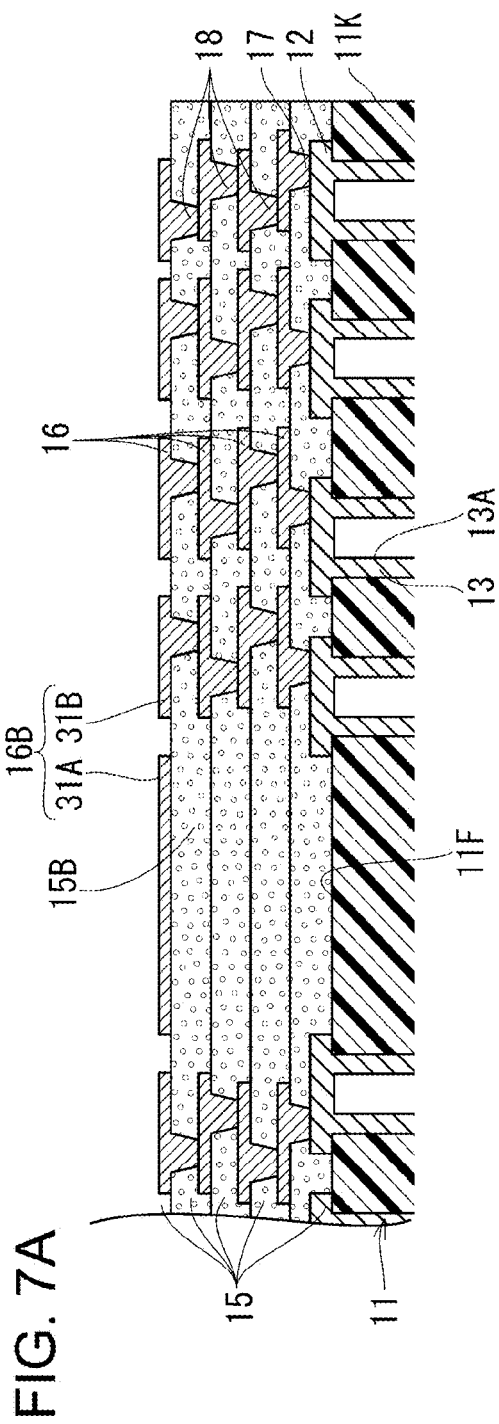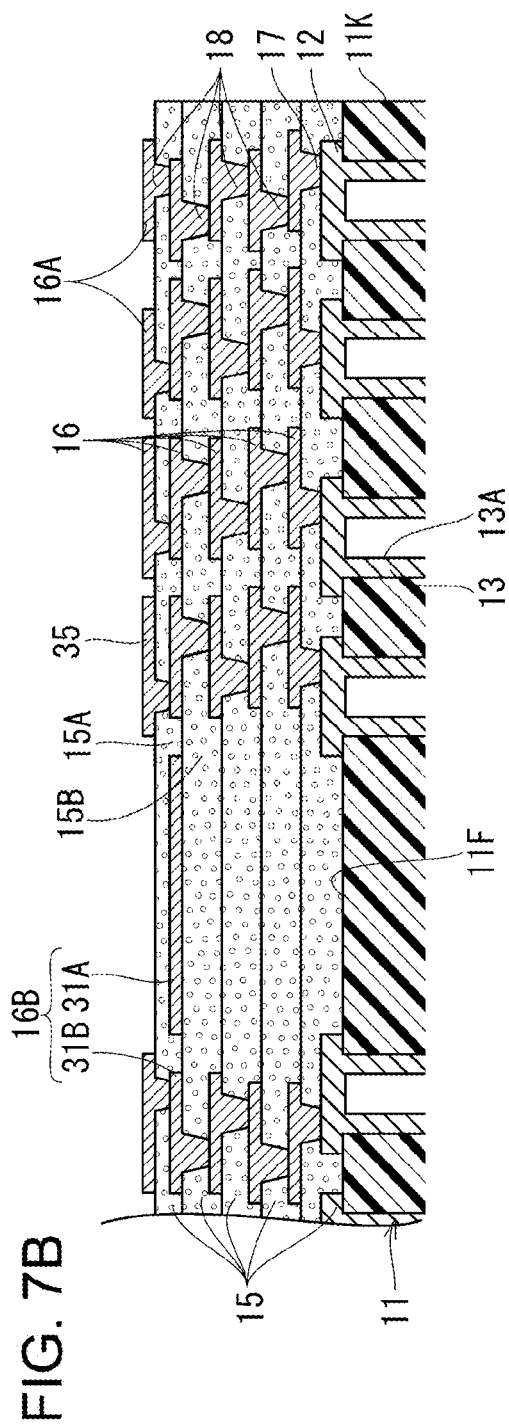

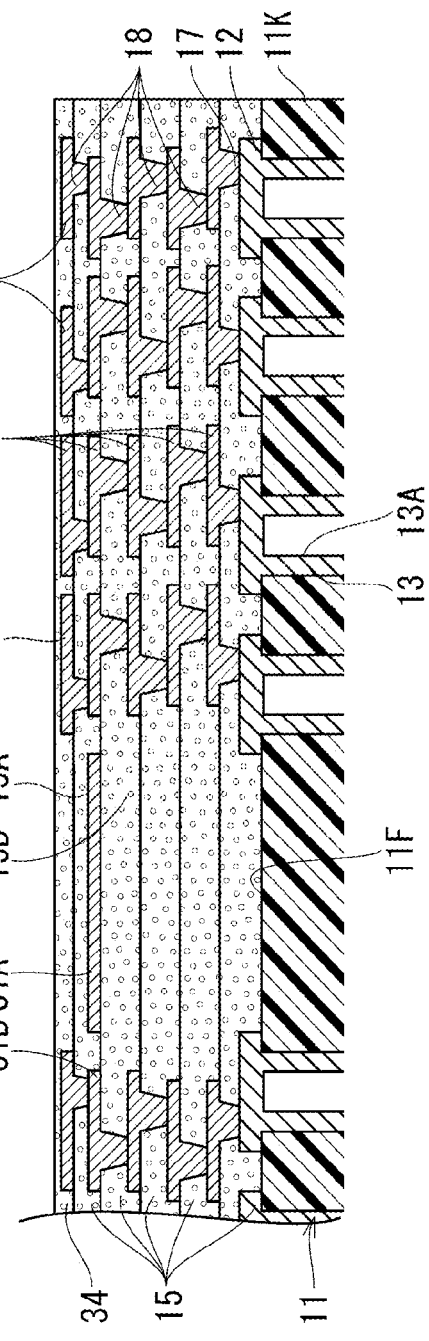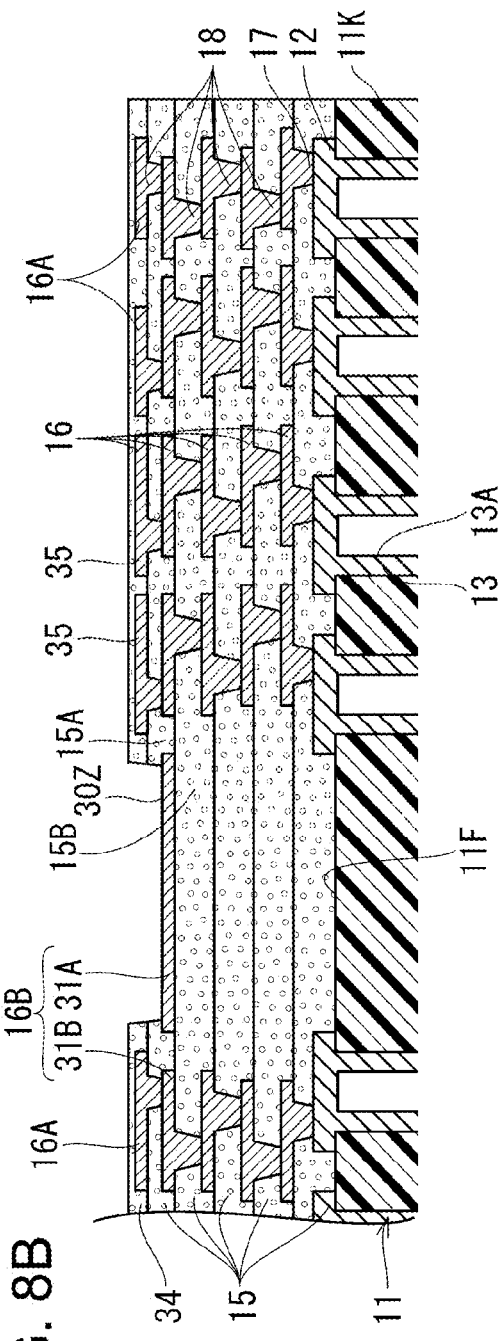

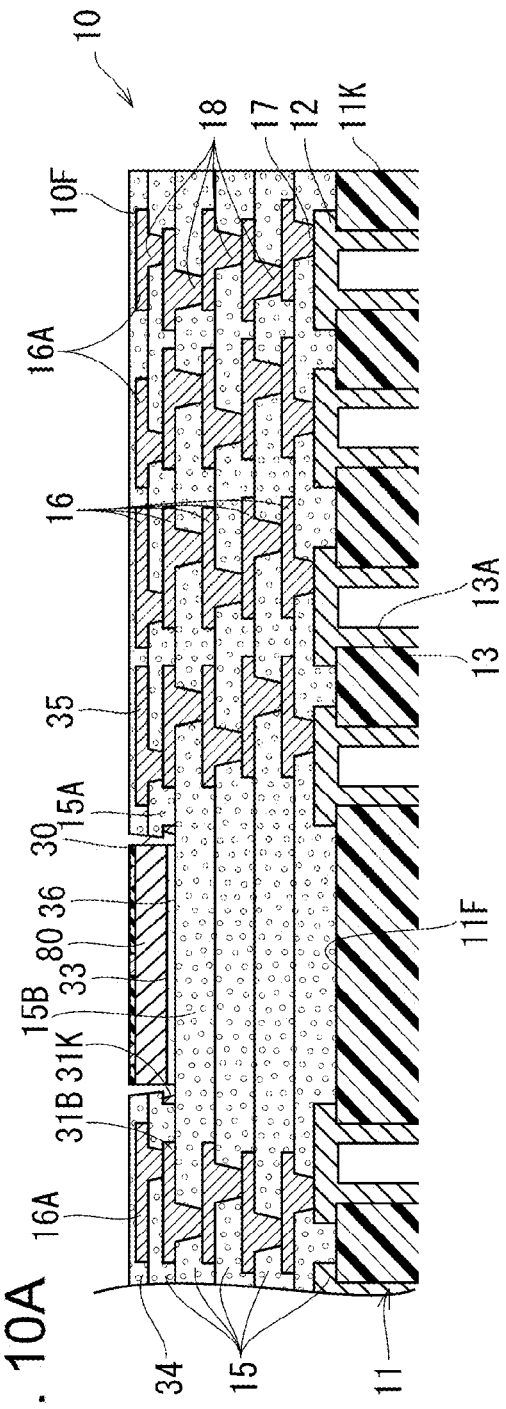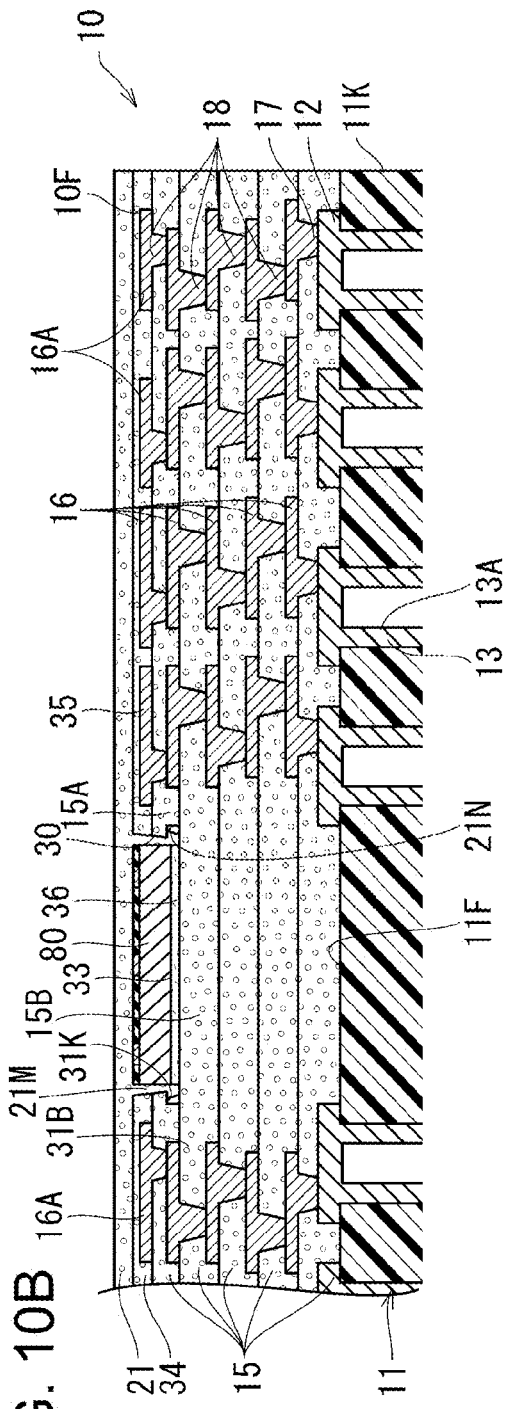

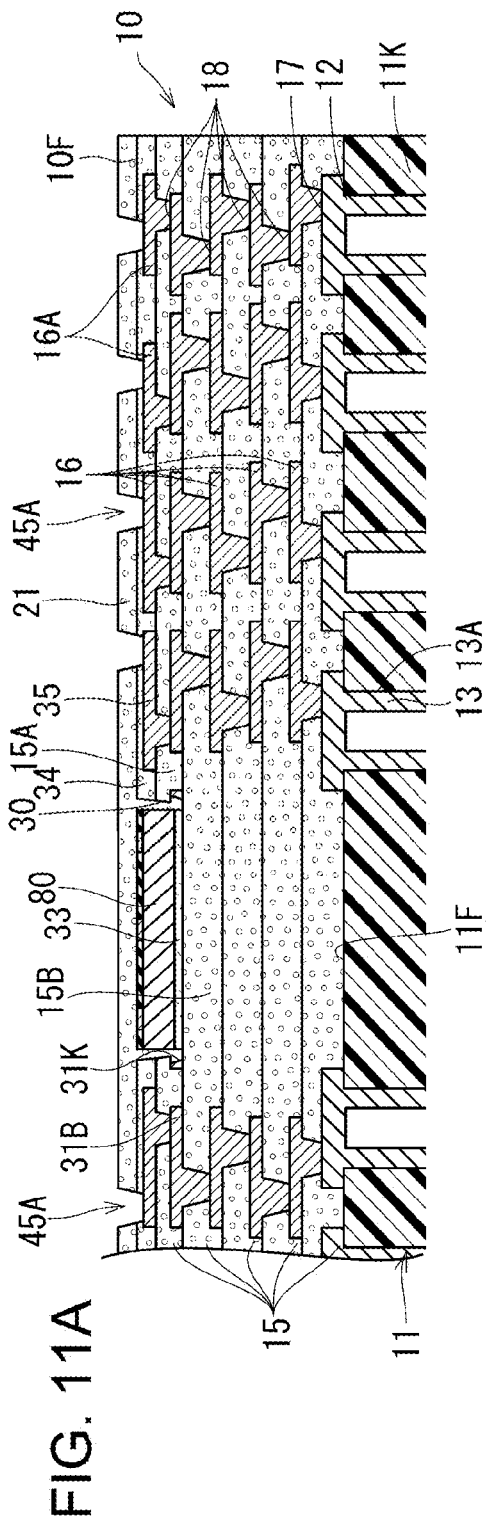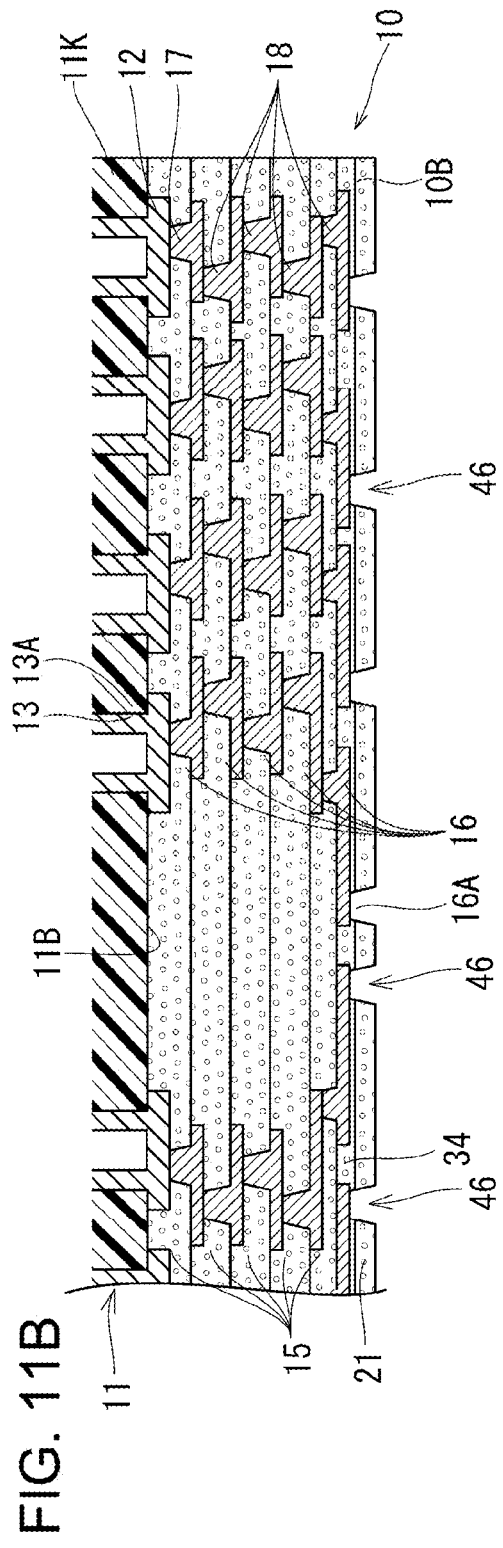

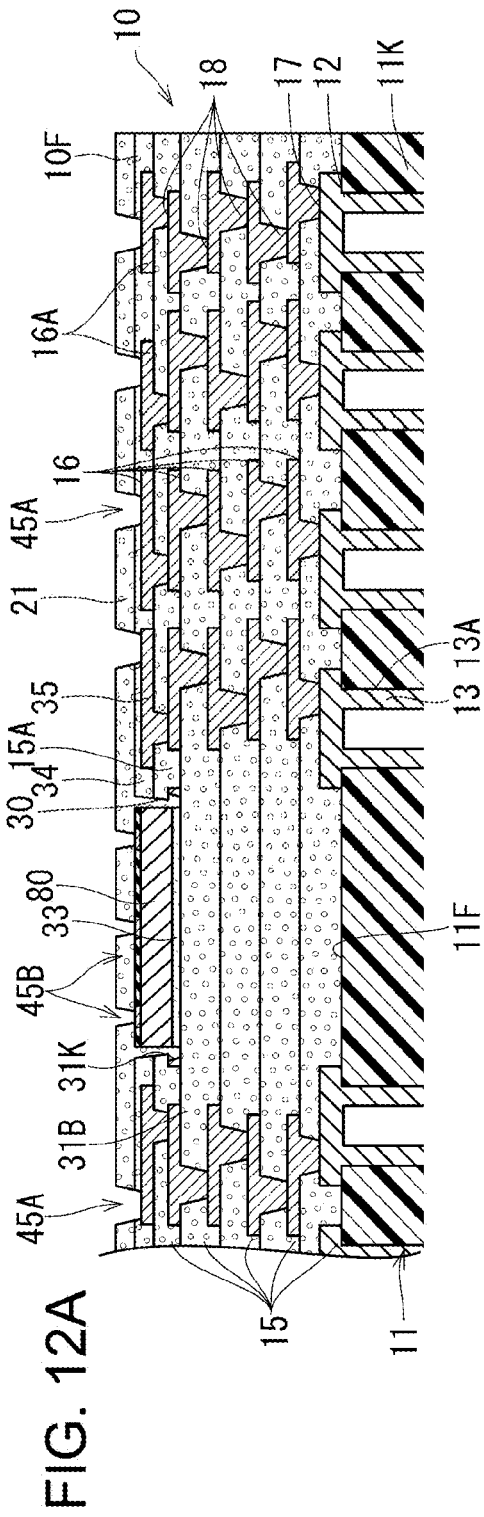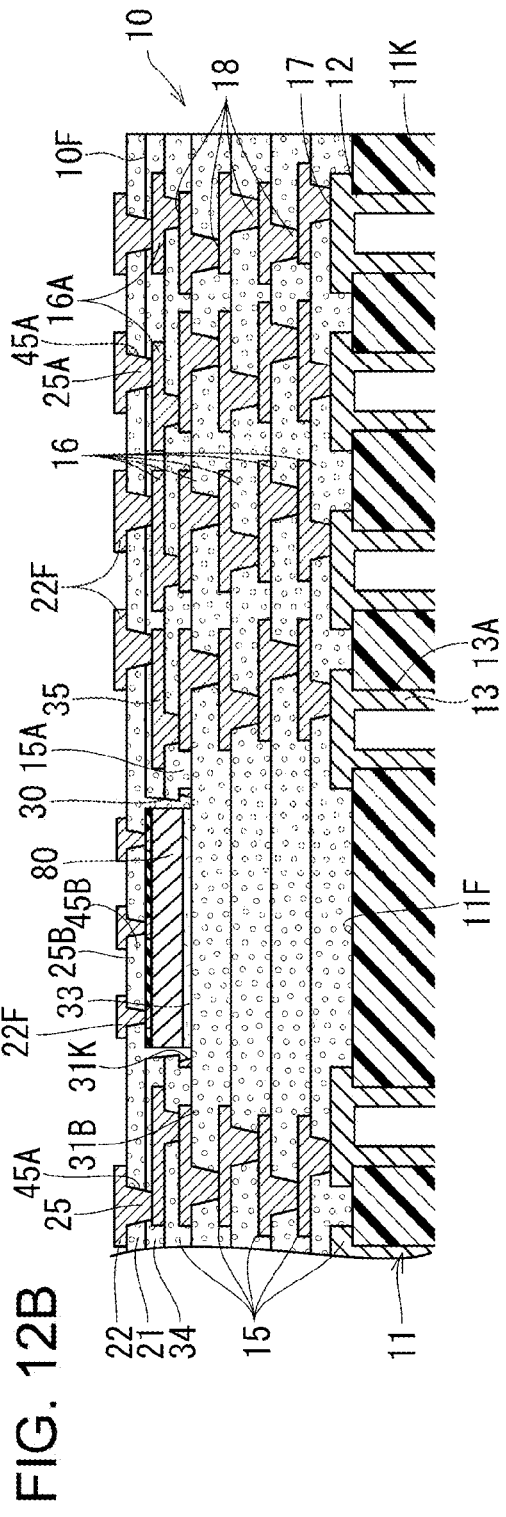

ELECTRONIC COMPONENT BUILT-IN WIRING BOARD AND METHOD FOR MANUFACTURING THE SAME

CROSS-REFERENCE TO RELATED APPLICATIONS

The present application is based upon and claims the benefit of priority to Japanese Patent Application No. 2019-089107, filed May 9, 2019, the entire contents of which are incorporated herein by reference.

BACKGROUND OF THE INVENTION

Field of the Invention

The present invention relates to an electronic component built-in wiring board in which an electronic component is accommodated in a cavity, and a method for manufacturing the electronic component built-in wiring board.

Description of Background Art

Japanese Patent Application Laid-Open Publication No. 2006-019441 describes an electronic component built-in wiring board in which an electronic component is placed on a plane layer exposed in a cavity. The entire contents of this publication are incorporated herein by reference.

SUMMARY OF THE INVENTION

According to one aspect of the present invention, a wiring board for a built-in electronic component includes a first insulating layer, a second insulating layer formed under the first insulating layer, and a conductor layer formed on an upper surface of the second insulating layer such that a cavity is formed to penetrate through the first insulating layer and the conductor layer and expose the second insulating layer at a bottom of the cavity and is formed to accommodate an electronic component therein. The first insulating layer and the conductor layer are formed such that the cavity has a first inner side surface extending from an upper opening edge to a position closer to the second insulating layer, and a lateral expansion part formed between a lower edge of the first inner side surface and the second insulating layer and extending outward from the lower edge of the first inner side surface.

According to another aspect of the present invention, a method for manufacturing a wiring board for a built-in electronic component includes preparing a substrate including a first insulating layer, a second insulating layer formed under the first insulating layer, and a conductor layer formed on an upper surface of the second insulating layer and including a conductor circuit layer and a plane layer, forming a cavity recess part penetrating through the first insulating layer such that the cavity recess part exposes the plane layer of the conductor layer, and etching a portion of the plane layer on an inner side of a lower edge of the cavity recess part such that the portion of the plane layer on the inner side of the lower edge of the cavity recess part is removed and that a cavity exposing the second insulating layer at a bottom of the cavity and configured to accommodate an electronic component therein is formed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 5A and 5B are cross-sectional views illustrating manufacturing processes of the cavity-having substrate;

FIGS. 6A and 6B are cross-sectional views illustrating manufacturing processes of the cavity-having substrate;

FIGS. 7A and 7B are cross-sectional views illustrating manufacturing processes of the cavity-having substrate;

FIGS. 8A and 8B are cross-sectional views illustrating manufacturing processes of the cavity-having substrate;

FIGS. 10A and 10B are cross-sectional views illustrating manufacturing processes of the electronic component built-in wiring board;

FIGS. 11A and 11B are cross-sectional views illustrating manufacturing processes of the electronic component built-in wiring board;

FIGS. 12A and 12B are cross-sectional views illustrating manufacturing processes of the electronic component built-in wiring board;

DETAILED DESCRIPTION OF THE EMBODIMENTS

Figure 1:
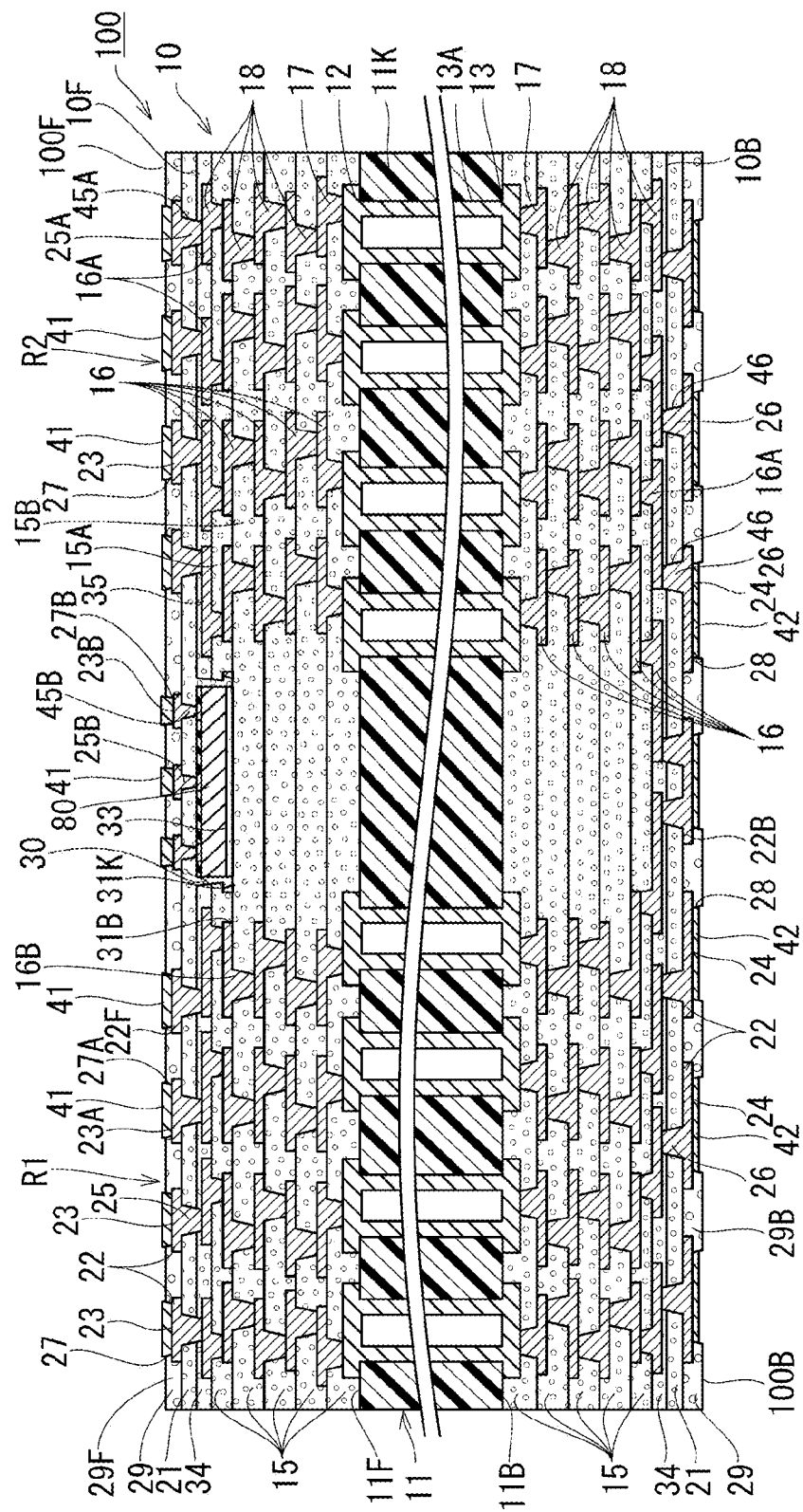
FIG. 1 is a cross-sectional view of an electronic component built-in wiring board according to an embodiment of the present invention.

Embodiments will now be described with reference to the accompanying drawings, wherein like reference numerals designate corresponding or identical elements throughout the various drawings.

In the following, an embodiment of the present invention is described with reference to FIGS. 1-16. As illustrated in FIG. 1, an electronic component built-in wiring board 100 according to the present embodiment has a structure in which an outer side build-up insulating layer 21 formed of an insulating material and an outer side build-up conductor layer 22 formed of a metal (for example, copper) are laminated on each of both front and back sides of a cavity-having substrate 10 (see FIG. 2) in which a semiconductor component 80 as an electronic component is accommodated in a cavity 30, and the outer side build-up conductor layers 22 are each covered by a solder resist layer 29. The solder resist layers 29 respectively form an F surface (100F) as a front side surface of the electronic component built-in wiring board 100 and a B surface (100B) as a back side surface of the electronic component built-in wiring board 100.

As illustrated in FIG. 1, in an F-surface solder resist layer (29F) that forms the F surface (100F) of the electronic component built-in wiring board 100, multiple openings 27 are formed that respectively expose portions of an F-surface outer side build-up layer (22F) as conductor pads 23, the F-surface outer side build-up layer (22F) being one of the outer side build-up layers 22 and being positioned on the F surface (100F) side. Specifically, the conductor pads 23 include first conductor pads (23A) that are formed on an outer side of the cavity 30 when viewed from a thickness direction and second conductor pads (23B) that overlap the semiconductor component 80, and the multiple openings 27 include multiple first openings (27A) that respectively expose the first conductor pads (23A) and multiple second openings (27B) that respectively expose the second conductor pads (23B).

Further, in a B-surface solder resist layer (29B) on the B surface (100B) side of the electronic component built-in wiring board 100, multiple third openings 28 are formed that respectively expose portions of a B-surface outer side build-up conductor layer (22B) on the B surface (100B) side as third conductor pads 24.

F-surface plating layers 41 are respectively formed on the first conductor pads (23A) and the second conductor pads (23B). The F-surface plating layers 41 on the first conductor pads (23A) are respectively filled in the first openings (27A) and each protrude in a bump-like shape to an outer side of the F-surface solder resist layer (29F). Similarly, the F-surface plating layers 41 on the second conductor pads (23B) are also respectively filled in the second openings (27B) and each protrude to the outer side of the F-surface solder resist layer (29F). Further, B-surface plating layers 42 are respectively formed on the third conductor pads 24. The B-surface plating layers 42 are respectively formed at bottoms of the third openings 28, and are recessed with respect to an outer surface of the B-surface solder resist layer (29B). The F-surface plating layers 41 and the B-surface plating layers 42 are each formed of an electroless Ni/Pd/Au metal layer.

Figure 2:
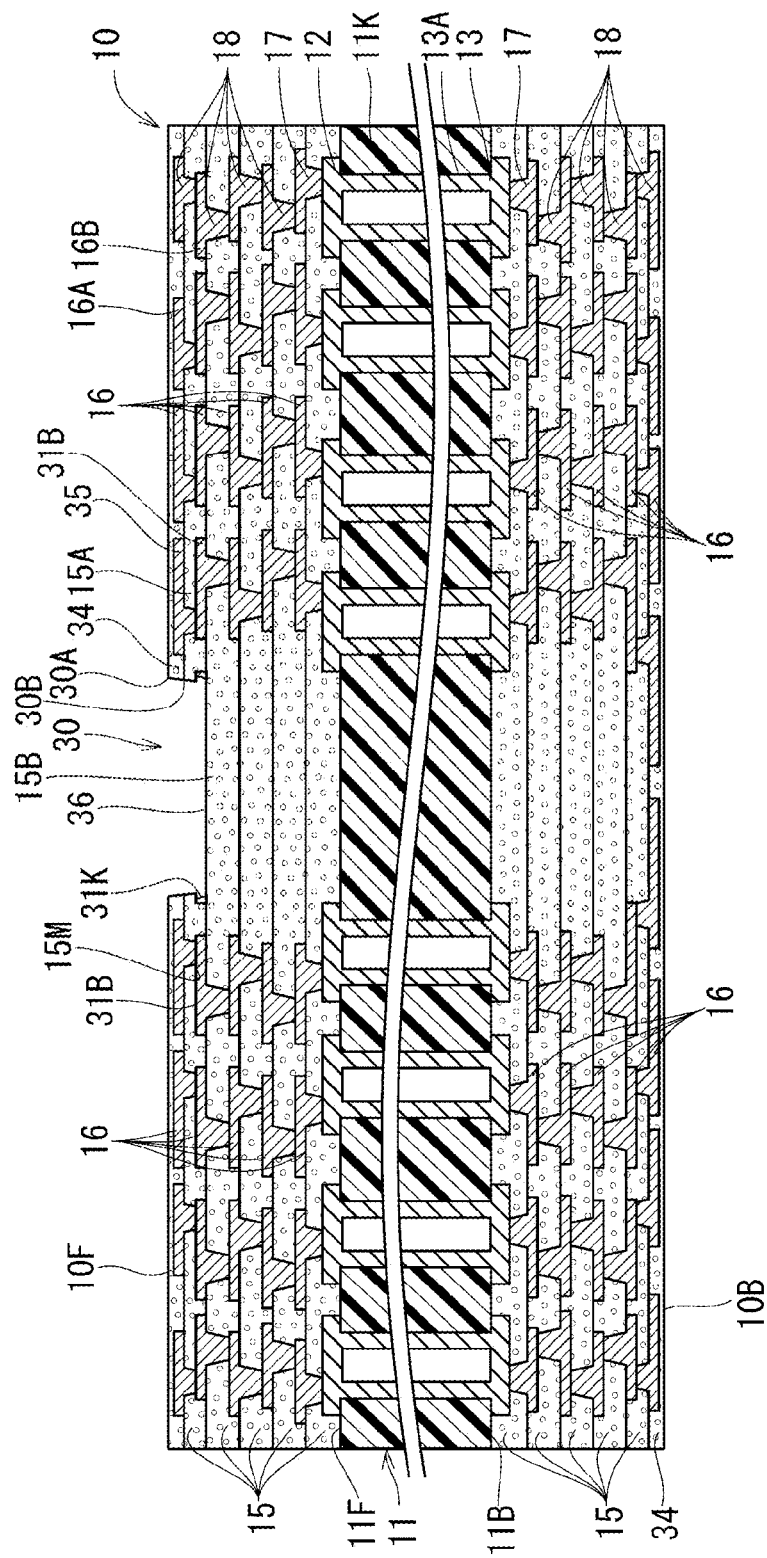
FIG. 2 is a cross-sectional view of a cavity-having substrate.

As illustrated in FIG. 2, the cavity-having substrate 10 has a multilayer structure in which build-up insulating layers 15 and build-up conductor layers 16 are alternately laminated on each of both an F surface (11F) as a front side surface and a B surface (11B) as a back side surface of a core substrate 11. The build-up insulating layers 15 are formed of the same material as the above-described outer side build-up insulating layers 21, and the build-up conductor layers 16 are formed of the same material as the above-described outer side build-up conductor layers 22.

A core conductor layer 12 is formed on each of both the front and back sides of the core substrate 11. The front side core conductor layer 12 and the back side core conductor layer 12 are connected to each other by through-hole conductors 13 penetrating the core substrate 11. The through-hole conductors 13 are formed by forming, for example, copper plating on wall surfaces of through holes (13A) penetrating the core substrate 11.

An innermost build-up conductor layer 16, which is closest to the core substrate 11, and a core conductor layer 12 are connected to each other by via conductors 17 penetrating an innermost build-up insulating layer 15. Further, build-up conductor layers (16, 16) that are adjacent to each other in a lamination direction are connected to each other by via conductors 18 penetrating a build-up insulating layer 15 positioned between the adjacent build-up conductor layers (16, 16).

A conductor circuit layer (31B) is formed in a second build-up conductor layer (16B) that is among the build-up conductor layers 16 laminated on the F surface (1F) side of the core substrate 11 and is positioned second from an outer side.

In a first build-up conductor layer (16A) that is among the build-up conductor layers 16 laminated on the F surface (11F) side of the core substrate 11 and is positioned outermost, a conductor circuit layer 35 is formed that is connected via the via conductors 18 to the conductor circuit layer (31B). Further, a protective insulating layer 34 is laminated on the first build-up conductor layer (16A). The protective insulating layer 34 is formed of the same material as the build-up insulating layers 15. The protective insulating layer 34 is thinner than each of the build-up insulating layers 15. The protective insulating layers 34 respectively form the F surface (10F) as the front side surface of the cavity-having substrate 10 and the B surface (10B) as the back side surface of the cavity-having substrate 10. It is also possible that the protective insulating layer 34 on the back side surface of the cavity-having substrate 10 is not formed. Further, it is also possible that the protective insulating layers 34 each have the same thickness as that of each of the build-up insulating layers 15.

The above-described conductor pads (23, 24) are connected to the first build-up conductor layers (16A) or the semiconductor component 80 via via conductors (25, 26) (see FIG. 1). Specifically, the first conductor pads (23A) and the third conductor pads 24 are connected to the first build-up conductor layers (16A) via first via conductors (25A) and the third via conductors 26, and the second conductor pads (23B) are connected to the semiconductor component 80 via second via conductors (25B).

The first via conductors (25A) and the third via conductors 26 are formed by filling plating in first via formation holes (45A) and third via formation holes 46 that penetrate the outer side build-up insulating layer 21 and the protective insulating layer 34, and the second via conductors (25B) are formed by filling plating in second via formation holes (45B) that penetrate the outer side build-up insulating layer 21. The second via formation holes (45B) are formed on the semiconductor component 80 and each expose a portion of the surface of the semiconductor component 80. A hole diameter of each of the second via formation holes (45B) is smaller than that of each of the first via formation holes (45A) and the third via formation holes 46. The first via formation holes (45A), the second via formation holes (45B) and the third via formation holes 46 are each formed in a tapered shape that is reduced in diameter toward a bottom thereof.

As illustrated in FIG. 2, the cavity 30 having an opening (30A) on the F surface (10F) is formed in the cavity-having substrate 10. The cavity 30 penetrates a first build-up insulating layer (15A) positioned on an outermost side and the protective insulating layer 34, and exposes a second build-up insulating layer (15B) positioned second from the outer side as a bottom surface 36 of the cavity 30. Further, in the present embodiment, the first build-up insulating layer (15A) is thinner than the second build-up insulating layer (15B).

Figure 3:
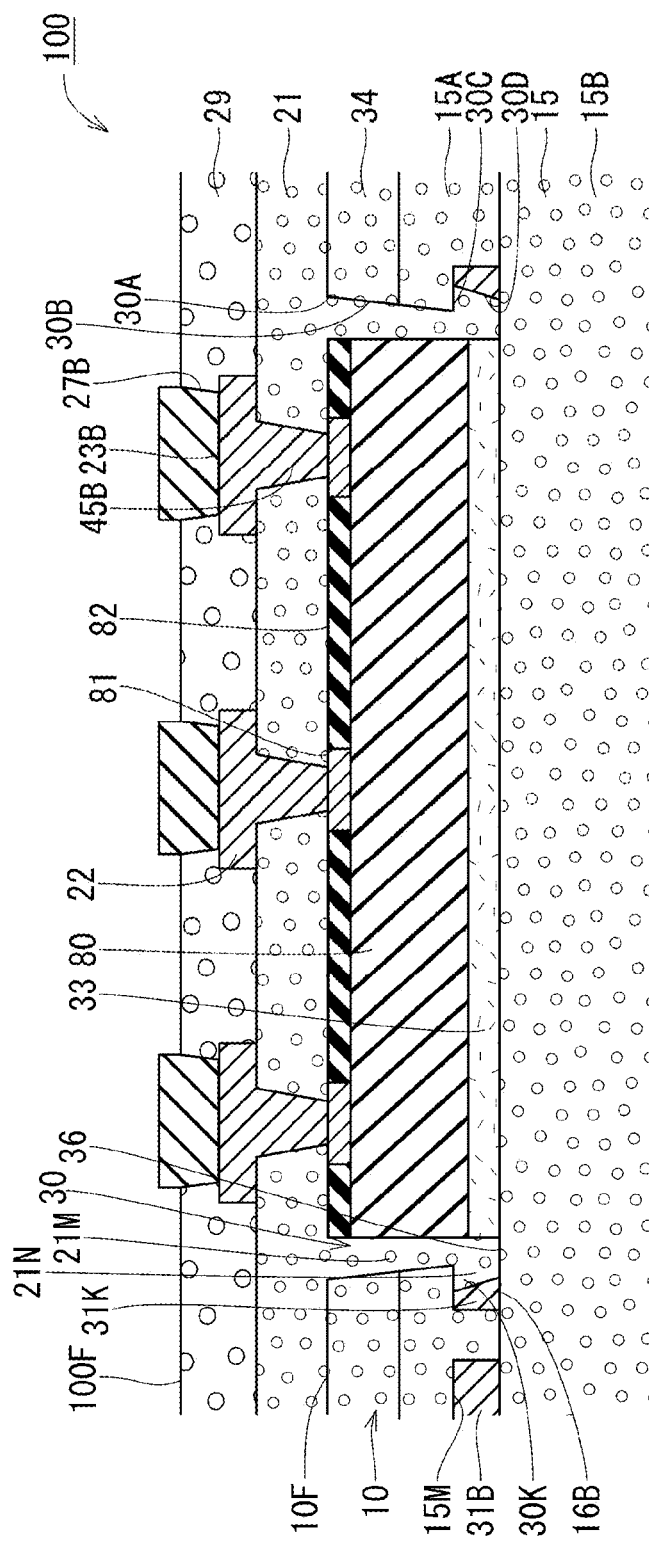
FIG. 3 is a cross-sectional view around an electronic component of the electronic component built-in wiring board.

As illustrated in FIG. 3, the cavity 30 has a first inner side surface (30B) that extends from the opening (30A) to a position closer to the second build-up insulating layer (15B) and is inclined such that the cavity 30 is reduced in cross section toward the bottom surface 36 side. It is also possible that the first inner side surface (30B) rises substantially perpendicular to the second build-up insulating layer (15B).

Here, the cavity 30 of the present embodiment has a lateral expansion part (30K) that extends from a lower edge of the first inner side surface (30B) toward an outer side between the lower edge of the first inner side surface (30B) and the second build-up insulating layer (15B). The lateral expansion part (30K) is formed by a ceiling surface (30C) that extends outward from the lower edge of the first inner side surface (30B), a second inner side surface (30D) that extends from an outer edge of the ceiling surface (30C) to an upper surface of the second build-up insulating layer (15B), and an outer edge portion of the bottom surface 36. Further, the ceiling surface (30C) is flush with a contact surface (15M) of the first build-up insulating layer (15A) that is in contact with the conductor circuit layer (31B).

Figure 4:
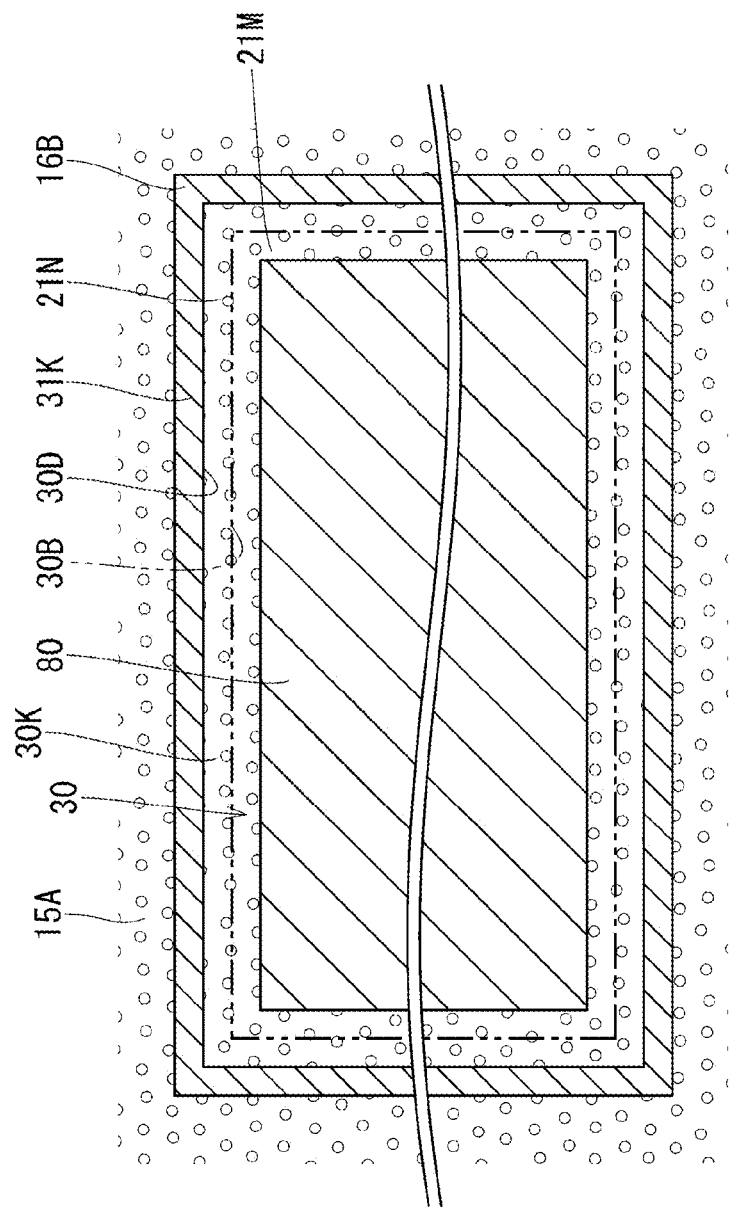
FIG. 4 is a cross-sectional plan view around a cavity of the cavity-having substrate.

As illustrated in FIGS. 3 and 4, the lateral expansion part (30K) is continuously or intermittently surrounded from an outer side by an annular conductor (31K) included in the second build-up conductor layer (16B). The annular conductor (31K) is adjacent to the lateral expansion part (30K), and an inner peripheral surface of the annular conductor (31K) forms the above-described second inner side surface (30D). The second inner side surface (30D) is inclined such that the cavity 30 is reduced in cross section toward the second build-up insulating layer (15B). Further, the second inner side surface (30D) is an etching surface formed by an etching treatment.

The semiconductor component 80 is accommodated in this cavity 30. The semiconductor component 80 includes a component body (80A), pads 81 provided on an upper surface of the component body (80A), and a passivation film 82 covering portions of the upper surface of the component body (80A) where the pads 81 are not formed, and the pads 81 are roughened. The semiconductor component 80 is mounted via the adhesive layer 33 on the second build-up insulating layer (15B) exposed as the bottom surface 36 of the cavity 30. The adhesive layer 33 has the same planar shape as the semiconductor component 80.

Further, a filling resin (21M), which is a resin exuded from the outer side build-up insulating layer 21, is filled in the cavity 30 between the inner side surfaces of the cavity 30 and the semiconductor component 80. The filling resin (21M) has a lower end protruding part (21N) filled in the lateral expansion part (30K).

The description about the structure of the electronic component built-in wiring board 100 is as given above. Next, a method for manufacturing the electronic component built-in wiring board 100 is described. Here, since the electronic component built-in wiring board 100 is manufactured using the cavity-having substrate 10, in the following, first, a method for manufacturing the cavity-having substrate 10 is described.

The cavity-having substrate 10 is manufactured as follows.

(1) As illustrated in FIG. 5A, the through holes (13A) are formed in the core substrate 11 by, for example, drilling or the like. The core substrate 11 is obtained by laminating a copper foil (not illustrated in the drawings) on each of both an F surface (11F), which is a front side surface of an insulating base material (11K), and a B surface (11B), which is a back side surface of the insulating base material (11K), the insulating base material (11K) being formed of an epoxy resin or a BT (bismaleimide triazine) resin and a reinforcing material such as a glass cloth.

(2) By an electroless plating treatment, a plating resist treatment and an electrolytic plating treatment, the core conductor layer 12 is formed on each of the F surface (11F) and the B surface (11B) of the core substrate 11, and the through-hole conductors 13 are formed on the inner surfaces of the through holes (13A) (see FIG. 5B).

(3) As illustrated in FIG. 6A, a build-up insulating layer 15 is laminated on the core conductor layer 12, and a build-up conductor layer 16 is laminated on the build-up insulating layer 15. Specifically, a resin film as a build-up insulating layer 15 is laminated on the core conductor layer 12 on each of the F surface (11F) side and the B surface (11B) side of the core substrate 11, and then, the resulting substrate is hot-pressed. Then, CO2 laser is irradiated to the resin film, and via formation holes penetrating the build-up insulating layer 15 are formed. Then, an electroless plating treatment, a plating resist treatment and an electrolytic plating treatment are performed. The via formation holes are filled with electrolytic plating and the via conductors 17 are formed, and a build-up conductor layer 16 of a predetermined pattern is formed on the build-up insulating layer 15. It is also possible that, as the build-up insulating layer 15, instead of the resin film, a prepreg (B-stage resin sheet obtained by impregnating a core material with resin) is used. In this case, a copper foil is laminated together with the prepreg.

(4) Similar to the process of FIG. 6A, build-up insulating layers 15 and build-up conductor layers 16 are alternately laminated on each of the F surface (11F) side and the B surface (11B) side of the core substrate 11 (see FIG. 6B; in FIG. 6B, only the F surface (11F) side is illustrated; this applies also in FIGS. 7A-9 in the following). In this case, the via conductors 18 penetrating the build-up insulating layers 15 are formed, and build-up insulating layers (16, 16) that are adjacent to each other in the lamination direction are connected to each other by the via conductors 18.

(5) As illustrated in FIG. 7A, a build-up insulating layer 15 is laminated, and a build-up conductor layer 16 is laminated on the build-up insulating layer 15, and the second build-up insulating layer (15B) and the second build-up conductor layer (16B) are formed. In this case, the conductor circuit layer (31B), which is connected to an inner side build-up conductor layer 16 via the via conductors 18, and the solid-shaped plane layer (31A) are formed in the second build-up conductor layer (16B).

(6) As illustrated in FIG. 7B, on the second build-up conductor layer (16B), a build-up insulating layer 15 and a build-up conductor layer 16 are laminated, and the first build-up insulating layer (15A) and the first build-up conductor layer (16A) are formed. In this case, on the plane layer (31A), only the first build-up insulating layer (15A) is laminated. Further, in the first build-up conductor layer (16A), the conductor circuit layer 35 connected to the conductor circuit layer (31B) via the via conductors 18 penetrating the first build-up insulating layer (15A) is formed.

(7) As illustrated in FIG. 8A, on the first build-up conductor layer (16A), the protective insulating layer 34 formed of the same material as the build-up insulating layers 15 is laminated. In this case, on the plane layer (31A), the first build-up insulating layer (15A) and the protective insulating layer 34 are laminated.

(8) As illustrated in FIG. 8B, by irradiating, for example, CO2 laser, a cavity recess part (30Z) that exposes the plane layer (31A) as a bottom surface thereof is formed in the protective insulating layer 34 and the first build-up insulating layer (15A). Here, an area of a range in which laser is irradiated, that is, an opening area of the cavity recess part (30Z), is smaller than an area of the plane layer (31A), so that the entire bottom surface of the cavity recess part (30Z) is formed by the plane layer (31A) alone.

Figure 9:
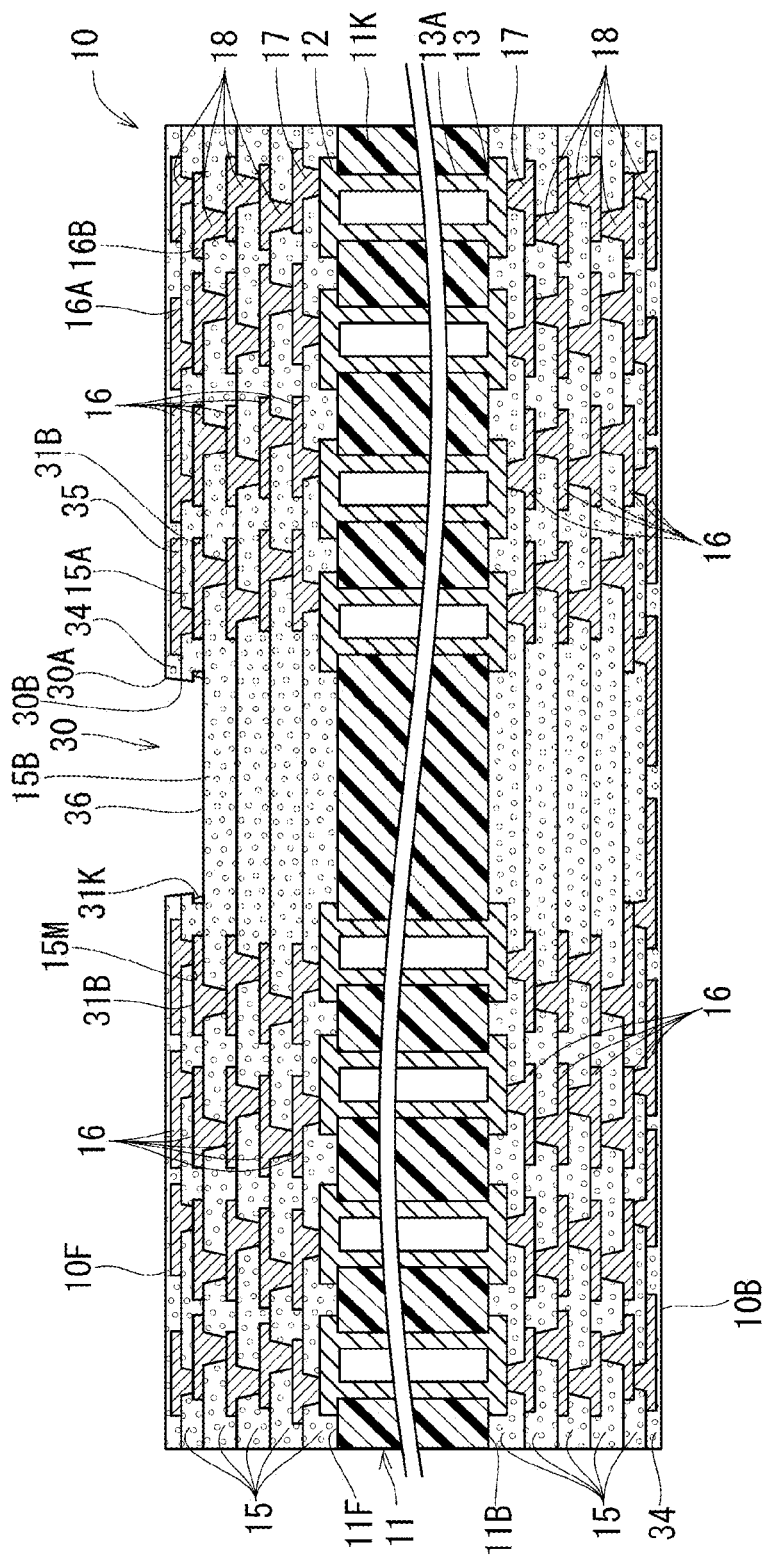
FIG. 9 is a cross-sectional view of the cavity-having substrate.

(9) The plane layer (31A) exposed as the bottom surface of the cavity recess part (30Z) is subjected to a desmear treatment, and then, the portion of the plane layer (31A) exposed from the cavity recess part (30Z) is removed by an etching process, and the cavity recess part (30Z) becomes the cavity 30 exposing the second build-up insulating layer (15B) as the bottom surface thereof. Further, a portion of a conductor of the plane layer (31A) on an outer side of an inner side surface (first inner side surface) of the cavity recess part (30Z) is also removed by the etching process, and the annular conductor (31K) remains and the lateral expansion part (30K) is formed. During the desmear treatment and the etching process, the conductor circuit layer (31B) included in the second build-up conductor layer (16B) is protected by the protective insulating layer 34. As a result, the cavity-having substrate 10 illustrated in FIG. 9 is completed.

The above is the description about the method for manufacturing the cavity-having substrate 10. Next, a method for manufacturing the electronic component built-in wiring board 100 using the cavity-having substrate 10 is described.

(1) As illustrated in FIG. 10A, the adhesive layer 33 is laminated on the second build-up insulating layer (15B) exposed as the bottom surface of the cavity 30, and the semiconductor component 80 is placed on the adhesive layer 33, and a thermal curing treatment and a CZ treatment are performed.

(2) The outer side build-up insulating layer 21 formed of the same material as the build-up insulating layers 15 is laminated on each of the F surface (10F) and the B surface (10B) of the cavity-having substrate 10 (see FIG. 10B; in FIG. 10B, only the F surface (10F) side is illustrated; this applies also to FIGS. 12A and 12B). In this case, the resin of the outer side build-up insulating layer 21 is also filled between the inner side surface of the cavity 30 and the side surface of the semiconductor component 80, and the filling resin (21M) and the lower end protruding part (21N) are formed.

(3) The first via formation holes (45A) are formed in the outer side build-up insulating layer 21 and the protective insulating layer 34 by irradiating laser (for example, CO2 laser) from the F surface (10F) side of the cavity-having substrate 10 (see FIG. 11A), and the third via formation holes 46 are formed by irradiating laser from the B surface (10B) side of the cavity-having substrate 10 (see FIG. 11B). Next, the second via formation holes (45B) having smaller diameters than the first via formation holes (45A) are formed in the outer side build-up insulating layer 21 by irradiating laser (for example, ultraviolet laser) from the F surface (10F) side of the cavity-having substrate 10 (see FIG. 12A). Then, the via formation holes (45A, 45B, 46) are subjected to a desmear treatment.

(4) An electroless plating treatment, a plating resist treatment and an electrolytic plating treatment are performed. The first via conductors (25A) and the second via conductors (25B) are respectively formed in the first via formation holes (45A) and the second via formation holes (45B) on the F surface (10F) side of the cavity-having substrate 10 (see FIG. 12B), and the third via conductors 26 are formed in the third via formation holes 46 on the B surface (10B) side of the cavity-having substrate 10. Further, the outer side build-up conductor layers 22 (the F-surface outer side build-up conductor layer (22F) and the B-surface outer side build-up conductor layer (22B)) are respectively formed on the outer side build-up insulating layers 21.

Figure 13:
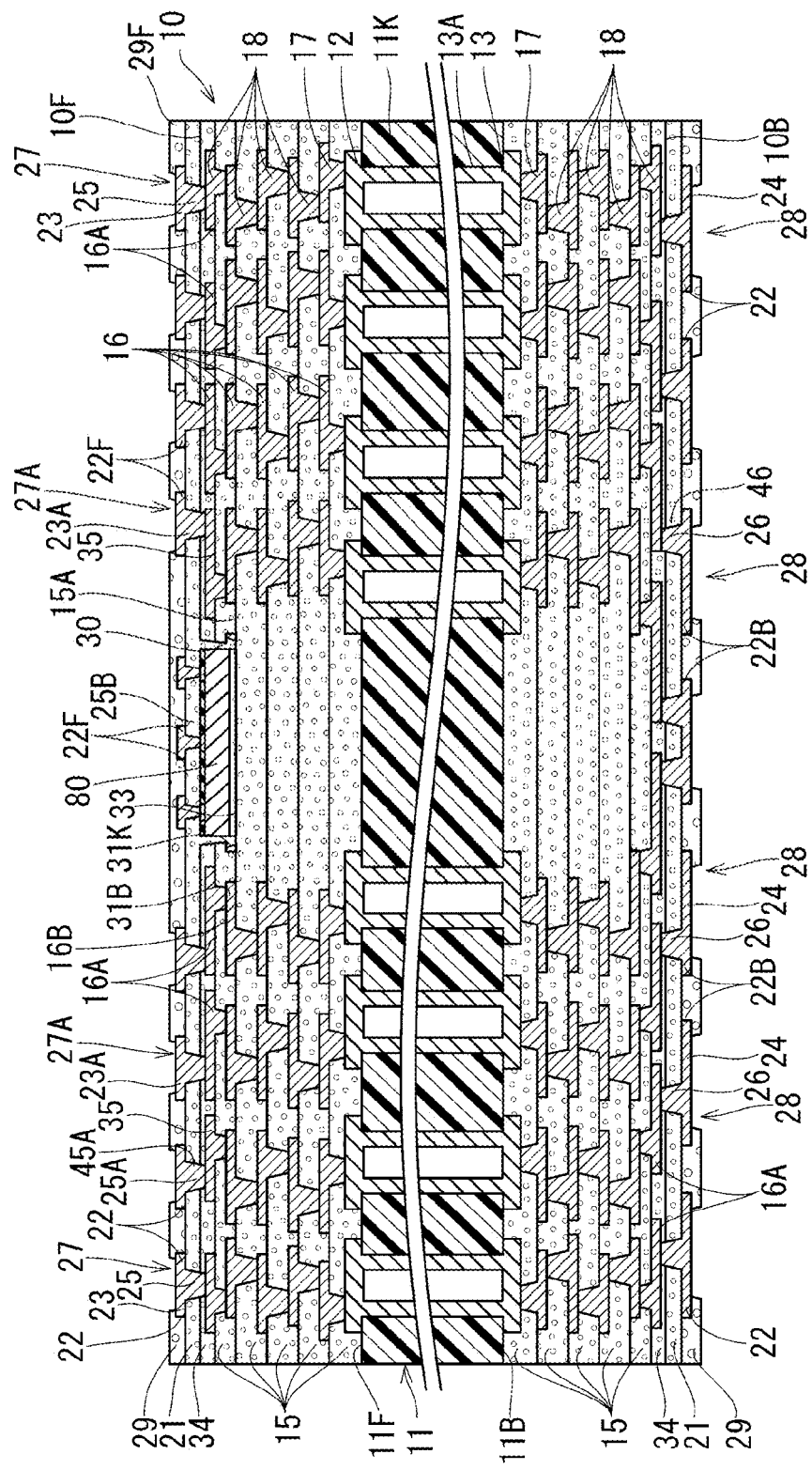
FIG. 13 is a cross-sectional view illustrating a manufacturing process of the electronic component built-in wiring board.

(5) As illustrated in FIG. 13, the solder resist layers 29 are respectively laminated on the outer side build-up conductor layers 22 from both the F surface (10F) side and the B surface (10B) side of the cavity-having substrate 10; and, by a lithographic treatment, the first openings (27A) that respectively expose portions of the F-surface outer side build-up conductor layer (22F) as the first conductor pads (23A) are formed in the F-surface solder resist layer (29F) on the F surface (10F) side of the cavity-having substrate 10, and the third openings 28 that respectively expose portions of the B-surface outer side build-up conductor layer (22B) as the third conductor pads 24 are formed in the B-surface solder resist layer (29B) on the B surface (10B) side.

Figure 14:
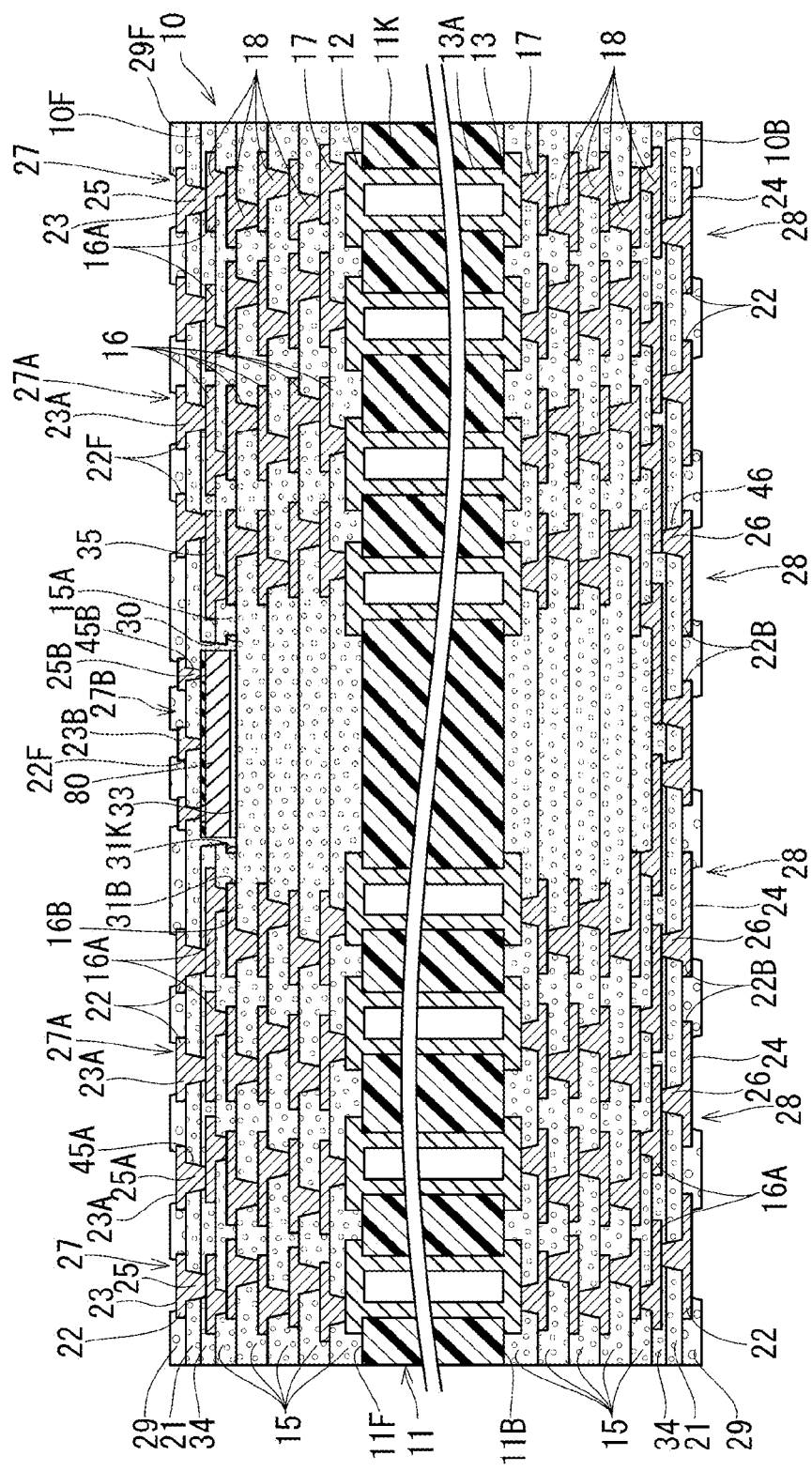
FIG. 14 is a cross-sectional view illustrating a manufacturing process of the electronic component built-in wiring board.

(6) As illustrated in FIG. 14, by irradiating laser (for example, ultraviolet laser) from the F surface (10F) side of the cavity-having substrate 10, the second openings (27B) are formed that respectively expose portions of the F-surface outer side build-up conductor layer (22F) overlapping the semiconductor component 80 as the second conductor pads (23B). Then, the first openings (27A), the second openings (27B), and the third openings 28 are subjected to a desmear treatment.

Figure 15:
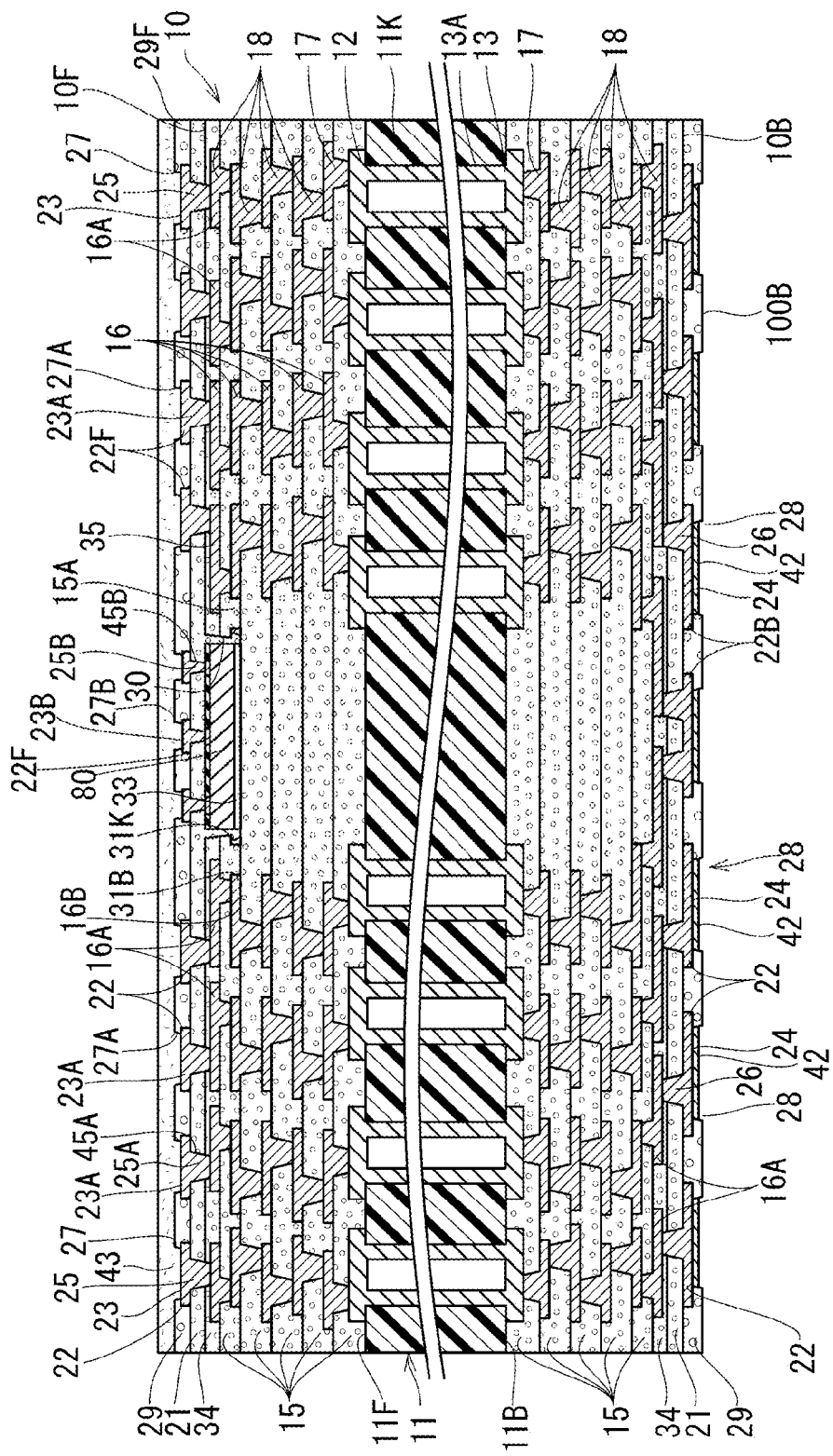
FIG. 15 is a cross-sectional view illustrating a manufacturing process of the electronic component built-in wiring board.

(7) As illustrated in FIG. 15, the F-surface solder resist layer (29F) is covered by a resin protective layer 43. Then, the B surface (10B) side of the cavity-having substrate 10 is subjected to an electroless plating treatment, and the B-surface plating layers 42 are respectively formed on the third conductor pads 24. Specifically, first, the substrate formed by covering the F-surface solder resist layer (29F) with the resin protective layer 43 is immersed in an electroless nickel plating solution for a predetermined time period, and a Ni layer is formed. Next, the resulting substrate is immersed in an electroless palladium plating solution for a predetermined time period, and a Pd layer is formed. Further, the resulting substrate is immersed in an electroless gold plating solution for a predetermined time period, and an Au layer is formed. When the electroless plating treatment is performed, the second conductor pads (23B) and first conductor pads (23A) are protected by the resin protective layer 43.

Figure 16:
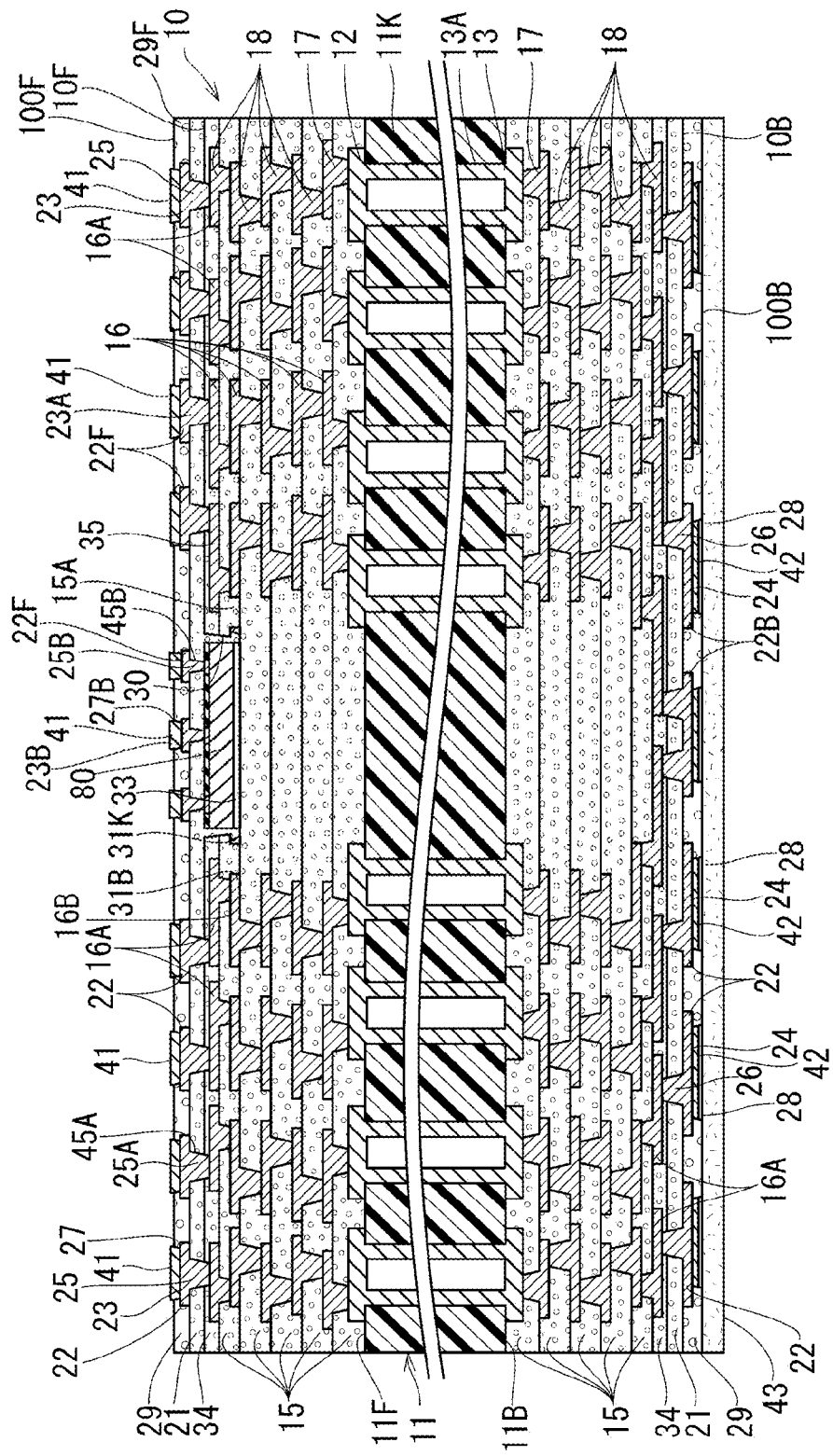
FIG. 16 is a cross-sectional view illustrating a manufacturing process of the electronic component built-in wiring board.

(8) As illustrated in FIG. 16, the resin protective layer 43 that covers the F-surface solder resist layer (29F) is removed, and the B-surface solder resist layer (29B) is covered by a resin protective layer 43. Then, similar to the process of FIG. 15, the F surface (10F) side of the cavity-having substrate 10 is subjected to an electroless plating treatment, and the F-surface plating layers 41 are respectively formed on the first conductor pads (23A) and the second conductor pads (23B). In this case, the B-surface plating layers 42 are protected by the resin protective layer 43.

(9) The resin protective layer 43 that covers the B-surface solder resist layer (29B) is removed, and the electronic component built-in wiring board 100 illustrated in FIG. 1 is completed.

The description about the structure and the manufacturing method of the electronic component built-in wiring board 100 of the present embodiment is as given above. Next, an operation effect of the electronic component built-in wiring board 100 is described.

According to the method for manufacturing electronic component built-in wiring board 100 of the present embodiment, the cavity 30 is formed by forming the cavity recess part (30Z) that exposes the plane layer (31A) as the bottom surface and then removing the plane layer (31A). Therefore, the thickness of the electronic component built-in wiring board 100 can be reduced as compared to an electronic component built-in wiring board having a cavity that exposes the plane layer (31A) as a bottom surface.

Further, in the electronic component built-in wiring board 100 of the present embodiment, the cavity 30 has the lateral expansion part (30K) that extends from the lower edge of the first inner side surface (30B) toward an outer side while exposing the second build-up insulating layer (15B) as the bottom surface 36. Therefore, the electronic component built-in wiring board 100 can be manufactured using the above-described method, and, as described above, the thickness of the electronic component built-in wiring board 100 can be reduced while the accommodation of the semiconductor component 80 can be stabilized.

Further, the filling resin (21M) of the outer side build-up insulating layer 21 has the lower end protruding part (21N) that extends into the lateral expansion part (30K). Therefore, the adhesion of the filling resin (21M) with the cavity 30 is stabilized, and the outer side build-up insulating layer 21 is unlikely to peel off. Further, the cavity 30 and the semiconductor component 80 are surrounded by the annular conductor (31K). Therefore, when the electronic component built-in wiring board 100 receives a pressure, the semiconductor component 80 is restricted in movement and is stabilized in position.

Other Embodiments

The present invention is not limited to the above-described embodiment. For example, embodiments described below are also included in the technical scope of the present invention. Further, in addition to the embodiments described below, the present invention can also be embodied in various modified forms within the scope without departing from the spirit of the present invention.

(1) In the above embodiment, as an electronic component according to an embodiment of the present invention, the semiconductor component 80 is described as an example. However, the electronic component may also be a semiconductor element, or a passive element such as a chip capacitor, an inductor, a resistor, or the like, or an interposer.

(2) In the above embodiment, the electronic component built-in wiring board 100 may also be a coreless substrate that does not have the core substrate 11.

(3) In the above embodiment, the annular conductor (31K) of the plane layer (31A) remains. However, it is also possible that the plane layer (31A) is entirely removed.

(4) It is also possible to adopt a structure in which only a portion of the plane layer (31A) exposed from the cavity recess part (30Z) is removed. That is, it is also possible that the lateral expansion part (30K) is not formed.

(5) It is also possible to use a method in which the plane layer (31A) is not formed and the second build-up insulating layer (15B) is directly exposed using laser.

In the electronic component built-in wiring board and a method for manufacturing the electronic component built-in wiring board in Japanese Patent Application Laid-Open Publication No. 2006-019441, thickness reduction is desired.

According to an embodiment of the invention, an electronic component built-in wiring board includes: a first insulating layer; a second insulating layer that is formed under the first insulating layer and on an upper surface of which a conductor layer is formed; a cavity that penetrates the first insulating layer and the conductor layer and exposes the second insulating layer as a bottom surface; and an electronic component accommodated in the cavity. The cavity has a first inner side surface that extends from an upper opening edge to a position closer to the second insulating layer, and a lateral expansion part that is formed between a lower edge of the first inner side surface and the second insulating layer and extends from the lower edge of the first inner side surface toward an outer side.

A method for manufacturing an electronic component built-in wiring board according to another embodiment of the present invention includes: preparing a substrate that includes a first insulating layer, and a second insulating layer that is formed under the first insulating layer and on an upper surface of which a conductor layer including a conductor circuit layer and a plane layer is formed; forming a cavity recess part that penetrates the first insulating layer and exposes the plane layer as a bottom surface; forming a cavity that exposes the second insulating layer as a bottom surface by removing a conductor of the plane layer on an inner side of a lower edge of the cavity recess part by etching; and accommodating an electronic component in the cavity.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board for a built-in electronic component, comprising:
   a first insulating layer;
   a second insulating layer formed under the first insulating layer; and
   a conductor layer formed on an upper surface of the second insulating layer such that a cavity is formed to penetrate through the first insulating layer and the conductor layer and expose the second insulating layer at a bottom of the cavity and is configured to accommodate an electronic component therein,
   wherein the first insulating layer and the conductor layer are formed such that the cavity has a first inner side surface extending from an upper opening edge to a position closer to the second insulating layer, and a lateral expansion part formed between a lower edge of the first inner side surface and the second insulating layer and extending outward from the lower edge of the first inner side surface, the conductor layer includes an annular conductor portion adjacent to the lateral expansion part, the lateral expansion part has a ceiling surface extending outward from the lower edge of the first inner side surface, and a second inner side surface extending from an outer edge of the ceiling surface to the upper surface of the second insulating layer, the lateral expansion part is formed such that the ceiling surface is flush with a contact surface of the first insulating layer in contact with an upper surface of the conductor layer, and that the second inner side surface is formed by an inner peripheral surface of the annular conductor portion, and the second inner side surface is inclined such that a cross section of the cavity is reduced toward the second insulating layer.

2. The wiring board according to claim 1, further comprising:
   the electronic component accommodated in the cavity formed through the first insulating layer and the conductor layer; and
   a filling resin filling an outer side of the electronic component in the cavity such that the filling resin is filling the lateral expansion part.

3. The wiring board according to claim 2, wherein the first insulating layer has a thickness that is thinner than a thickness of the second insulating layer.

4. The wiring board according to claim 1, further comprising:
an outer side conductor layer laminated on the first insulating layer; and
a protective layer laminated on the outer side conductor layer such that the cavity is penetrating through the protective layer.

5. The wiring board according to claim 4, further comprising:
the electronic component accommodated in the cavity formed through the first insulating layer and the conductor layer; and
a filling resin filling an outer side of the electronic component in the cavity such that the filling resin is filling the lateral expansion part.

6. The wiring board according to claim 1, wherein the first insulating layer has a thickness that is thinner than a thickness of the second insulating layer.

7. The wiring board according to claim 6, further comprising:
an outer side conductor layer laminated on the first insulating layer; and
a protective layer laminated on the outer side conductor layer such that the cavity is penetrating through the protective layer.

8. The wiring board according to claim 7, further comprising:
the electronic component accommodated in the cavity formed through the first insulating layer and the conductor layer; and
a filling resin filling an outer side of the electronic component in the cavity such that the filling resin is filling the lateral expansion part.

9. The wiring board according to claim 1, further comprising:
an outer side conductor layer laminated on the first insulating layer.

10. The wiring board according to claim 9, further comprising:
the electronic component accommodated in the cavity formed through the first insulating layer and the conductor layer.

11. The wiring board according to claim 10, wherein the first insulating layer has a thickness that is thinner than a thickness of the second insulating layer.

12. The wiring board according to claim 9, further comprising:
the electronic component accommodated in the cavity formed through the first insulating layer and the conductor layer; and
a filling resin filling an outer side of the electronic component in the cavity such that the filling resin is filling the lateral expansion part.

13. The wiring board according to claim 12, wherein the first insulating layer has a thickness that is thinner than a thickness of the second insulating layer.

14. The wiring board according to claim 9, wherein the first insulating layer has a thickness that is thinner than a thickness of the second insulating layer.

15. The wiring board according to claim 1, further comprising:
the electronic component accommodated in the cavity formed through the first insulating layer and the conductor layer.

16. The wiring board according to claim 15, wherein the first insulating layer has a thickness that is thinner than a thickness of the second insulating layer.

17. The wiring board according to claim 1, further comprising:
a protective layer laminated on the first insulating layer such that the cavity is penetrating through the protective layer.

18. The wiring board according to claim 17, further comprising:
the electronic component accommodated in the cavity formed through the first insulating layer and the conductor layer; and
a filling resin filling an outer side of the electronic component in the cavity such that the filling resin is filling the lateral expansion part.

19. The wiring board according to claim 17, wherein the first insulating layer has a thickness that is thinner than a thickness of the second insulating layer.

20. A method for manufacturing a wiring board for a built-in electronic component, comprising:
preparing a substrate comprising a first insulating layer, a second insulating layer formed under the first insulating layer, and a conductor layer formed on an upper surface of the second insulating layer and including a conductor circuit layer and a plane layer;
forming a cavity recess part penetrating through the first insulating layer such that the cavity recess part exposes the plane layer of the conductor layer; and
etching a portion of the plane layer on an inner side of a lower edge of the cavity recess part such that the portion of the plane layer on the inner side of the lower edge of the cavity recess part is removed and that a cavity exposing the second insulating layer at a bottom of the cavity and configured to accommodate an electronic component therein is formed,
wherein the etching includes etching a portion of the plane layer on an outer side of the lower edge of the cavity recess part such that the portion of the plane layer on the outer side of the lower edge of the cavity recess part is removed and that a lateral expansion part is formed in the cavity, the etching includes etching the conductor layer such that an annular conductor portion of the conductor layer is formed adjacent to the lateral expansion part, the etching includes etching the conductor layer such that the lateral expansion part is formed to have a ceiling surface extending outward from a lower edge of a first inner side surface of the cavity recess part, and a second inner side surface extending from an outer edge of the ceiling surface to the upper surface of the second insulating layer, that the ceiling surface is formed to be flush with a contact surface of the first insulating layer in contact with an upper surface of the conductor layer, and that the second inner side surface is formed by an inner peripheral surface of the annular conductor portion, and the second inner side surface is inclined such that a cross section of the cavity is reduced toward the second insulating layer.

* * * * *